US007619455B2

(12) United States Patent
Carlson et al.

(10) Patent No.: US 7,619,455 B2
(45) Date of Patent: Nov. 17, 2009

(54) DIGITAL SINGLE EVENT TRANSIENT HARDENED REGISTER USING ADAPTIVE HOLD

(75) Inventors: Roy M. Carlson, Plymouth, MN (US); David O. Erstad, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/737,225

(22) Filed: Apr. 19, 2007

(65) Prior Publication Data

US 2008/0258792 A1    Oct. 23, 2008

(51) Int. Cl.
    *H03K 3/356* (2006.01)
(52) U.S. Cl. .................. 327/212; 327/199; 327/201
(58) Field of Classification Search ......... 327/199–203, 327/208–212, 218, 34
    See application file for complete search history.

(56) References Cited

U.S. PATENT DOCUMENTS

| 4,775,840 | A * | 10/1988 | Ohmori et al. ................. 327/34 |
| 5,504,703 | A | 4/1996 | Bansal |
| 5,896,299 | A | 4/1999 | Ginetti et al. ............... 364/490 |
| 6,127,864 | A | 10/2000 | Mavis et al. ................ 327/144 |
| 6,239,616 | B1 | 5/2001 | Churcher et al. ............. 326/49 |
| 6,326,809 | B1 | 12/2001 | Gambles et al. ............... 326/46 |
| 6,356,101 | B1 | 3/2002 | Erstad ......................... 326/27 |
| 6,362,676 | B1 | 3/2002 | Hoffman |
| 6,629,276 | B1 | 9/2003 | Hoffman et al. |
| 6,972,607 | B1 * | 12/2005 | Chen et al. .................... 327/291 |
| 7,142,004 | B2 | 11/2006 | Calrson ........................ 326/14 |
| 2001/0048341 | A1 | 12/2001 | Chakravarthy .............. 327/551 |
| 2006/0119379 | A1 | 6/2006 | Carlson ....................... 326/14 |
| 2006/0119410 | A1 | 6/2006 | Carlson ...................... 327/310 |
| 2006/0267653 | A1 | 11/2006 | Fulkerson ................... 327/208 |

FOREIGN PATENT DOCUMENTS

| EP | 0 135 893 A1 | 9/1984 |
| WO | WO 01/10026 A1 | 2/2001 |

OTHER PUBLICATIONS

W. Wang, "RC Hardened FPGA Configuration SRAM Cell Design," Electronic Letters, Apr. 29, 2004, vol. 40, No. 9.
Mavis, David G., et al. "Soft Error Rate Mitigation Techniques for Modern Microcircuits," IEEE 02CH37320, 40th Annual International Reliability Physics Symposium, Dallas, Texas 2002.

(Continued)

*Primary Examiner*—Lincoln Donovan
*Assistant Examiner*—Daniel Rojas
(74) *Attorney, Agent, or Firm*—Shumaker & Sieffert, P.A.

(57) ABSTRACT

By adjusting a register's capturing clock edge timing so that the register captures data when the data returns to a correct state, the register may be protected against DSET upsets. If a data glitch occurs near the clock edge, the valid time at the register output is increased (CLK to Q). This valid time increase occurs when the presence of a DSET transient is detected near the clock edge.

19 Claims, 6 Drawing Sheets

OTHER PUBLICATIONS

Mongkolkachit et al., "Design Technique for Mitigation of Alpha-Particle-Induced Single-Event Transients in Combinational Logic," IEEE Transactions on Device and Materials Reliability, vol. 3, No. 3, Sep. 2003..

Benedetto et al., "Heavy Ion-Induced Digital Single-Event Transients in Deep Submicron Processes," IEEE Transactions on Nuclear Science, vol. 51, No. 6, Dec. 2004.

Gadlage et al., "Single Event Transient Pulsewidths in Digital Microcircuits," IEEE Transactions on Nuclear Science, vol. 51, No. 6, Dec. 2004.

Benedetto et al., "Variation of Digital Set Pulse Widths and the Implications for Single Event Hardening of Advanced CMOS Processes," IEEE Transactions on Nuclear Science, vol. 52, No. 6, Dec. 2005.

Balasubramanian et al., "RHBD Techniques for Mitigating Effects of Single-Event Hits Using Guard-Gates," IEEE Transactions on Nuclear Science, vol. 52, No. 6, Dec. 2005.

Wang et al., "Edge Triggered Pulse Latch Design with Delayed Latching Edge for Radiation Hardened Application," IEEE Transactions on Nuclear Science, vol. 51, No. 6, Dec. 2004.

Eaton et al., "Single Event Transient Pulsewidth Measurements Using a Variable Temporal Latch Technique," IEEE Transactions on Nuclear Science, vol. 51, No. 6, Dec. 2004.

HX5000 ASIC Platform S150 (150 nm) ASICs, Honeywell International Inc., Aug. 2006.

Mavis, David G. "Single Event Transient Phenomena—Challenges and Solutions," 2002 Microelectronics Reliability and Qualification Workshop Dec. 3-4, 2002. DTRA, Defense Threat Reduction Agency.

Mavis et al., "SEU and Set Mitigation Techniques for FPGA Circuit and Configuration Bit Storage Design," Sep. 26-28, 2000. MRC Microelectronics, MAPLD-2000, www.mrcmicroe.com.

European Search Report for 08103600.6-2215 dated Oct. 14, 2008.

* cited by examiner

# DIGITAL SINGLE EVENT TRANSIENT HARDENED REGISTER USING ADAPTIVE HOLD

FIELD

The present invention relates generally to circuit hardening techniques, and more particularly, relates to hardening a register against digital single event transients.

BACKGROUND

Single Event Upset (SEU) is a radiation-induced error in a semiconductor device caused when charged particles lose energy by ionizing the medium through which they pass, leaving behind a wake of electron-hole pairs. The electron-hole pairs form a parasitic conduction path, which can cause a false transition on a node. The false transition, or glitch, can propagate through the semiconductor device and may ultimately result in the disturbance of a node containing state information, such as an output of a latch, register, or gate.

Typically, an SEU is caused by ionizing radiation components, such as neutrons, protons, and heavy ions. The ionizing radiation components are abundant in space and at commercial flight altitudes. Additionally, an SEU may be caused by alpha particles from the decay of trace concentrations of uranium and thorium present in some integrated circuit packaging. As another example, an SEU may be caused by detonating nuclear weapons. When a nuclear weapon is detonated, intense fluxes of gamma rays, x-rays, and other high energy particles are created, which may cause SEU.

Digital Single Event Transient (DSET) is a type of SEU that happens when a transient pulse occurs near a capturing clock edge of a register. Because of the close timing between the transient pulse and the clock pulse, the register may store an incorrect state. As registers are common in circuit designs, it is beneficial to harden registers against DSET so that the registers can be used in space and other harsh environments where SEU is a concern.

A common hardening technique is triple modular redundancy (TMR). TMR is implemented by creating three identical copies of a module and feeding the module outputs into a majority voter, which determines the most popular of the three outputs. Thus, if one of the three modules produces an incorrect result, the majority voter still provides the correct result as an output since the other two modules' outputs agree. Unfortunately, TMR does not completely protect against DSET unless implemented in both combinational logic and the register. If TMR is implemented only in the register, and not in the logic, transient glitches in the logic can still cause incorrect data to be stored in the TMR register. Another common hardening technique, adding a switchable RC delay that is switched into a low impedance or bypassed state when the latch is written, is also ineffective in protecting against DSET.

Typically, filtering is used to protect against DSET. However, filtering DSET pulses on a data path increases the setup time of the register, regardless of whether a DSET event is occurring. For example, Honeywell's HX5000 SET hardened register adds about 1ns of delay. The increased setup time is undesirable because it reduces the useful operating frequency of the register.

Thus, it would be beneficial to harden a register without filtering so that the register may be used in applications that are susceptible to DSET.

SUMMARY

A system and method for hardening registers is described. The system includes a data storage element, such as a register, operable to latch data based on a clock input and a clock circuit that controls the clock input to the data storage element. The clock circuit increases a hold time of the data storage element up to a time period (Td) after a transient pulse occurs on a data input to the data storage element so as to delay when the register latches data. Td is approximately equal to an expected duration of a DSET pulse.

The clock circuit may include a plurality of logic gates to detect the transient pulse. Additionally, the clock circuit may include a delay circuit that determines the duration of the amount of time. The delay circuit may include a capacitor and a size of the capacitor determines the duration of Td. The delay circuit may also include an inverter. The inverter may be designed to delay a data output transition after a data input transition occurs on the input to the inverter.

In another example, the system includes a data storage element, such as a register, operable to latch data based on two clock signals, a delay circuit that receives and inverts a first data input to provide a second data input, and a clock circuit that receives the first data input, the second data input, and a clock input and provides as an output two clock outputs that control the two clock signals. The delay circuit inverts and delays the first data input by a time period (Td) to create the second data input. The clock circuit increases a hold time of the data storage element up to Td after a transient pulse occurs on a data input to the data storage element.

The delay circuit may include an inverter that inverts the first data input to provide the second data input. The inverter may be designed to delay a data output transition after a data input transition. The delay circuit may also include a capacitor connected to an output of the inverter and a size of the capacitor may determine duration of Td. Td is approximately equal to an expected duration of a DSET pulse.

The clock circuit may include an AND gate, an OR gate, a NAND gate, and a NOR gate. The AND gate and the OR gate each receive the first data input and the second data input. The NAND gate receives the clock input and an output of the OR gate and provides the first clock output. The NOR gate receives an output of the NAND gate and an output of the AND gate and provides the second clock output. The first and second clock outputs are complementary and true internal data storage element clock signals.

The method for hardening registers includes detecting that a data input to a data storage element has a first transition from a first state to a second state and determining whether the first transition occurs within a time period (Td) prior to a capturing clock edge. If the first transition occurs within Td, the method includes delaying the capturing clock edge. The method also includes determining whether the data input has a second transition from the second state to the first state within Td after the first transition and, if so, capturing the first state. Td may be an expected duration of a DSET pulse.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
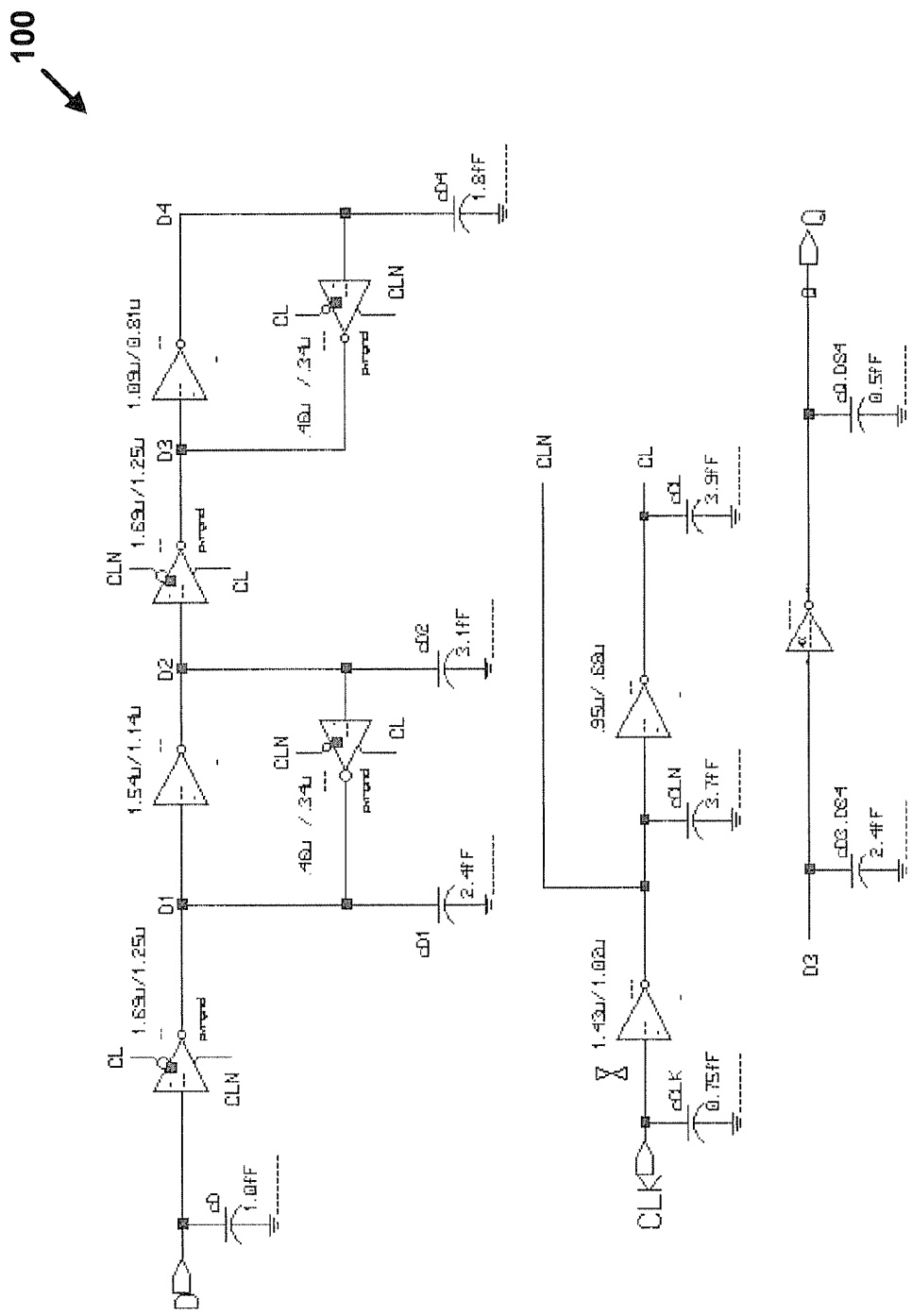
FIG. 1 is a schematic diagram of a register, according to an example.

FIG. 1 is a schematic diagram of a typical register 100. The register 100 is a rising-edge triggered master-slave D-type flip-flop. The rising-edge triggered master-slave D-type flip-flop is well known in the art. Other schematic diagrams may also be used to represent a rising-edge triggered master-slave D-type flip-flop. While the following description refers to the register 100, the invention is not limited to this particular register type and may apply generally to data storage elements, such as latches.

The register 100 includes a data input (D) and a clock input (CLK). From the CLK input, internal complementary and true clock signals CLN and CL are created. For a rising-edge triggered master-slave D-type flip-flop, when the clock input signal is low (logic 0), the internal clock signals CLN and CL "enable" the first or "master" D latch so that the logic state on the data input D is written into the master latch. This allows the master latch to store the data input value when the clock signal transitions from low to high. As the clock signal goes high, the clocks CL and CLN disable the master latch and the value seen at the data input to the master latch is locked.

Nearly simultaneously, when the clock input (CLK) transitions from a low to a high state, the second or "slave" D latch transitions from a disabled to an enabled state. This allows the signal captured at the rising edge of the clock, by the now locked master latch, to pass through the slave latch. When the clock signal returns to low, the output (Q) of the slave latch is locked, and the value seen at the last rising edge of the clock is held, while the master latch begins to accept new values in preparation for the next rising clock edge.

If a transient pulse appears on the data input before the rising edge of the clock signal, erroneous data may be captured by the master latch, flow through the slave latch, and be provided at the data output. Thus, it would be beneficial to adjust the register hold time to avoid latching erroneous data.

Figure 2:
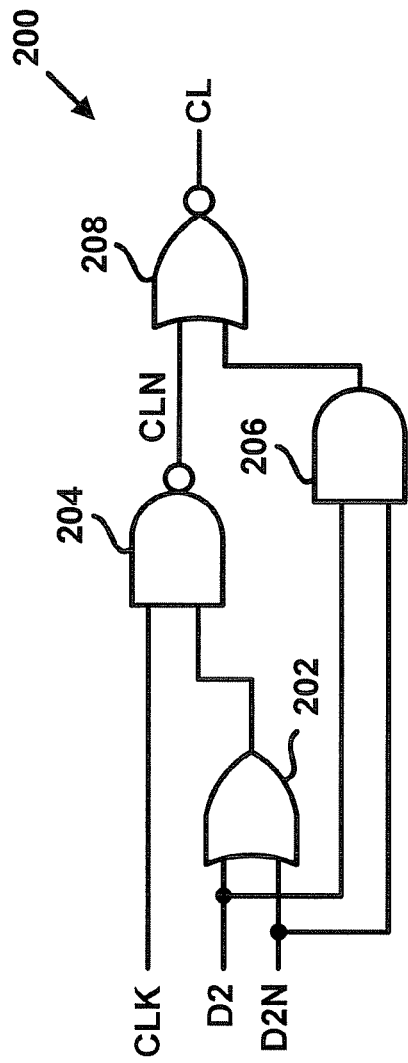
FIG. 2 is a clock circuit diagram for a master latch in the register depicted in FIG. 1, according to an example.

FIG. 2 is a logic diagram of a clock circuit 200 whose outputs (CL, CLN) are used to provide true and complement clock signals to the master and slave latches in the register 100. The clock circuit 200 increases the register hold time after a data transition near the capturing clock edge of the register 100. An internal state of the register 100 is used to adjust the timing of the internal clock edges. If the data transition occurs near the clock sampling edge, the clock timing is adjusted so that the data input continues to be sampled for a period beyond the normal hold time. Thus, the hold time is increased when the data transition occurs near the clock sampling edge.

The clock circuit 200 includes an OR gate 202, a NAND gate 204, an AND gate 206, and a NOR gate 208. The clock circuit 200 receives three inputs, the input clock signal (CLK), an internal data state of the register data input (D2), and an inverted internal data state input (D2N). The clock circuit 200 provides as an output the clock signals (CL, CLN). The input clock signal is the signal typically provided to the register 100, while the output clock signals are the modified clock signals that are provided to harden the register 100 against DSET as described as follows.

Figure 3:
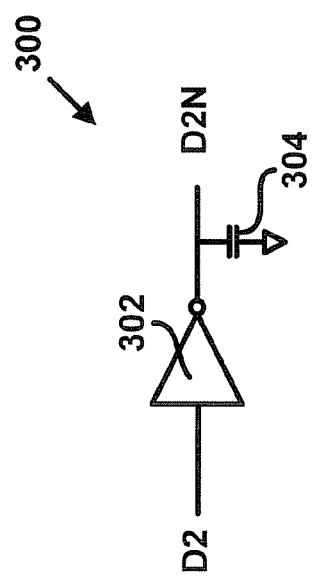
FIG. 3 is a delay circuit diagram for use with the clock circuit depicted in FIG. 2, according to an example.

The internal data state (D2) and the inverted internal data state (D2N) are provided as inputs to the OR gate 202 and the AND gate 206. As seen in FIG. 3, the internal data state is an input to an inverter 302 and the inverted internal data state is the output of the inverter 302. Thus, in normal operation, the internal data state and the inverted internal data state are at different logic levels (i.e., when D2=0, D2N=1 and when D2=1, D2N=0). When a transient pulse occurs on the data input (D), the internal data state and the inverted internal data state may be at the same logic level for a period of time as controlled by a tuning capacitor 304.

The tuning capacitor 304 may be connected to the output of the inverter 302 to add a delay for pulse migration from the input to the output of the inverter 302. The size of the capacitor 304 may control the duration of the delay. For example, the tuning capacitor 304 may be a 100 fF capacitor. Because the inverter 302 and the capacitor 304 are not in either the feedback loop of the master latch or the data path between the master and slave latch of the register 100, the size of the tuning capacitor 304 may not affect the setup time of the register 100. For example, a capacitance from approximately 100 fF to 200 fF does not appear to increase the setup time of the register 100.

Alternatively, instead of connecting the tuning capacitor 304 to the output of the inverter 302, the inverter 302 may be designed to add delay. For example, the inverter 302 may be fabricated as shown in FIG. 4.

Figure 4:
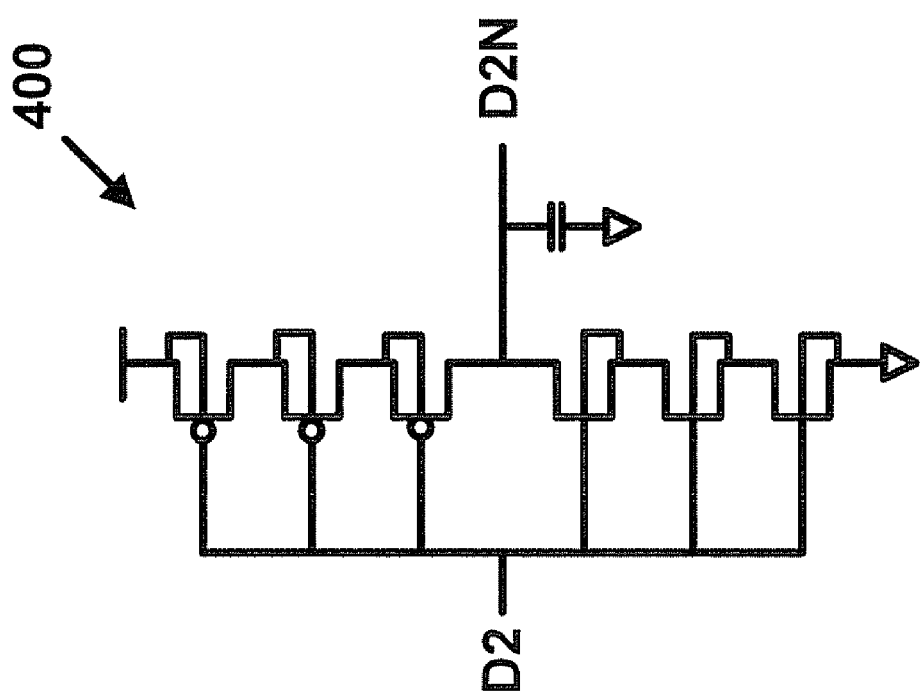
FIG. 4 is a schematic diagram for an inverter for use with the clock circuit depicted in FIG. 2, according to an example.

FIG. 4 depicts a transistor circuit 400 that functions as a slow inverter. The transistors are depicted as complementary metal-oxide semiconductor (CMOS) transistors; however, other transistor types may be employed. The P-type transistors may be formed using a 1.04 u/0.2 u width/length ratio, while the N-type transistors may be formed using a 0.45 u/0.2 u width/length ratio. The capacitor may be a metal oxide semiconductor capacitor (MOSCAP), which may be programmable from 0-14 fF.

Returning back to FIG. 2, the output of the OR gate 202 is high unless both data inputs (D2, D2N) are low, indicating a first glitch condition. The output of the AND gate 206 is low unless both data inputs are high, indicating a second glitch condition. The output of the NAND gate 204 (CLN), which is the modified, inverted version of the input clock signal to the register 100 (CLK), is high when the input clock signal (CLK) is low. The output of the NAND gate 204 is also high when the clock signal is high and both of the data inputs are low indicating the first glitch condition. Otherwise, the output of the NAND gate 204 is low.

The output of the NOR gate 208 (CL) is the modified, non-inverted version of the input clock signal (CLK) applied to the register 100. The output clock signal (CL) remains low when the input clock signal remains low. The output clock signal (CL) also remains low if either the first or second glitch conditions occur. When the input clock signal goes high and neither of the glitch conditions occurs, the output clock signal (CL) also goes high.

As a result, the rising edge of the output clock signal (CL) and the falling edge of the inverted output clock signal (CLN) are delayed until the DSET pulse completes so long as the pulse width is relatively short. The delay occurs in the presence of the DSET transient near the clock edge and the duration of the delay is based on the smaller of the duration of the transient pulse or the delay across the delay inverter 300 or 400. While some delay is associated with adjusting the hold time, the delay penalty that appears on the register output Q is limited to when and as long as the delay is needed.

The clock circuit 200 is connected to the clock input of the master latch of the register 100 as the transient pulse typically occurs at a data input to the master latch. The clock circuit 200 may also be connected to the clock input of the slave latch. However, the slave latch may be hardened in other manners as known in the art.

Figure 5:
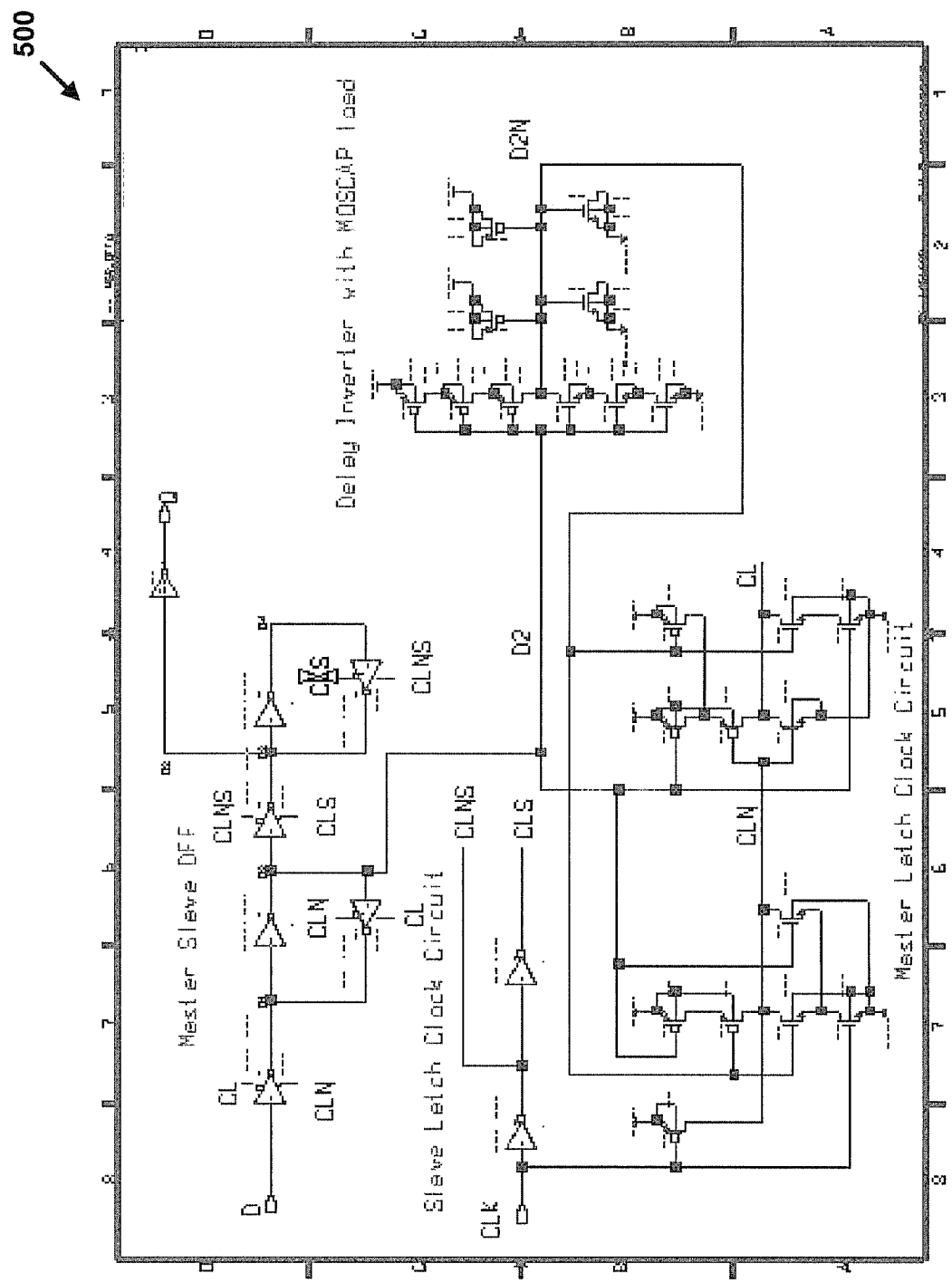
FIG. 5 is a schematic diagram of a hardened register, according to an example.

FIG. 5 is a schematic diagram of a hardened register 500. The hardened register 500 is the register 100 hardened with the clock circuit 200. In this example, the register 500 includes the slow inverter 400. Additionally or alternatively, the register 500 may include the tuning capacitor 304. Of course, other circuit designs may be used for the register 100 and/or the clock circuit 200.

Figure 6:
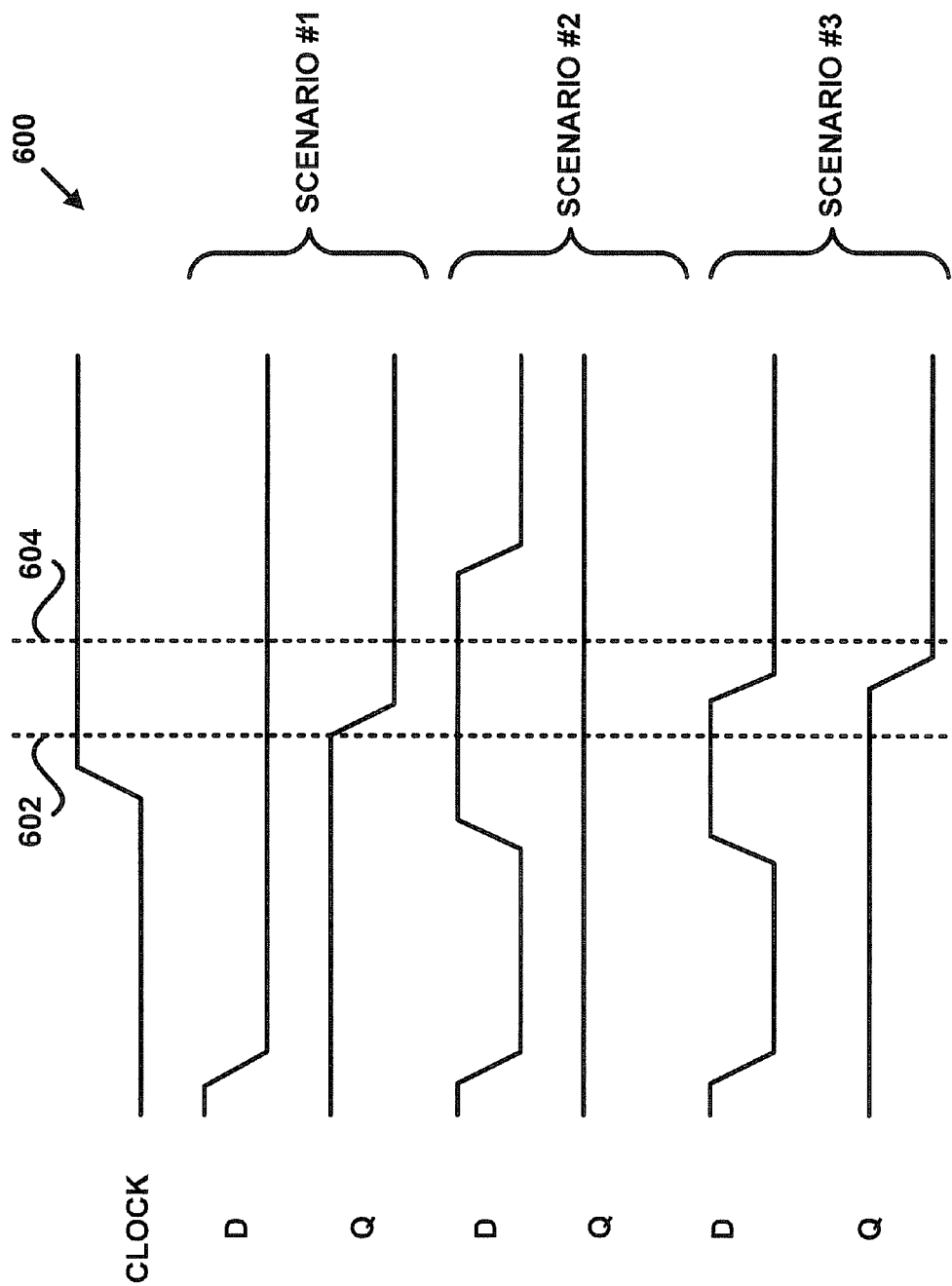
FIG. 6 is a timing diagram, according to an example.

FIG. 6 is a timing diagram 600 depicting a clock signal, three potential register data inputs (D), and three corresponding register outputs (Q). The first data input/output sequence (scenario #1) shows the normal operation of the register 100. The second data input/output sequence (scenario #2) shows the operation of the register 100 when the duration of the transient pulse exceeds a time period (Td). The third data input/output sequence (scenario #3) shows the operation of the register 100 when the duration of the transient pulse falls within the time period. The left hand vertical dashed line 602 represents the normal hold time of the register 100, while the right hand vertical dashed line 604 represents the hold time after adjustment by a time period in the presence of a data transition near the capturing clock edge.

The data input (D) in scenario #1 is a data input that is not impacted by a transient pulse. The data input is low when the clock transitions from low to high. As the register 100 is a rising-edge triggered register, the data output (Q) transitions from high to low as expected.

The data input in scenario #2 is a data input that is impacted by a transient pulse having a relatively long duration. The data input is expected to be low at the rising edge of the clock signal, but the transient pulse changes the data input to a logic 1 before the rising edge of the clock signal. Because the transient pulse on the data input lasts longer than the hold time, the data output remains high. In this scenario, the register 100 stores incorrect data.

The data input in scenario #3 is a data input that is impacted by a transient pulse having a relatively short duration. The data input is expected to be low at the rising edge of the clock signal, but the transient pulse changes the data input to a logic 1 before the rising edge of the clock signal. However, because the transient pulse duration is relatively short, the data input returns to the correct state before the adjusted hold time indicated by line 604, and the data output transitions to the correct low state. Thus, the register 100 latches the correct data despite the DSET.

The increased hold time of the latch may allow the end of the transient pulse into the register 100, returning the latch to the correct state, provided the transient pulse duration is short enough. The return of the latch to the correct state causes the output (Q) of the register 100 to also transition to the correct state. The valid time of this transition on Q will be later in time than the normal time at which Q would change (i.e., the valid time of Q). The increase in the Q valid time depends on the arrival time and duration of the transient pulse.

The increase in the Q valid time may result in a failure of a setup time on a latch whose input is derived from the Q output of the latch that has a transient pulse on its input. The overall probability of a DSET which results in a setup time failure due to the valid time increase on Q may depend on several factors. The overall probability may be based on the probability of occurrence of the charge deposited by the hit, the timing of the hit, the probability that the circuit is on a critical path that is active, and the probability that the circuit requires the entire margin already included for random variation.

Based on the calculated overall probability of DSET, the time period Td may be designed for a worse case scenario. For example, the worse case scenario may include a circuit design with slow transistors operating at a low voltage level in high temperatures. However, a delay time designed for the worse case scenario may be too long, impacting the speed of the circuit. As another example, the time period Td may be designed to reduce impacts to circuit operation, but allowed some transient pulses with longer pulse durations to be latched by the register 100 as described with respect to scenario #2.

Figure 7:
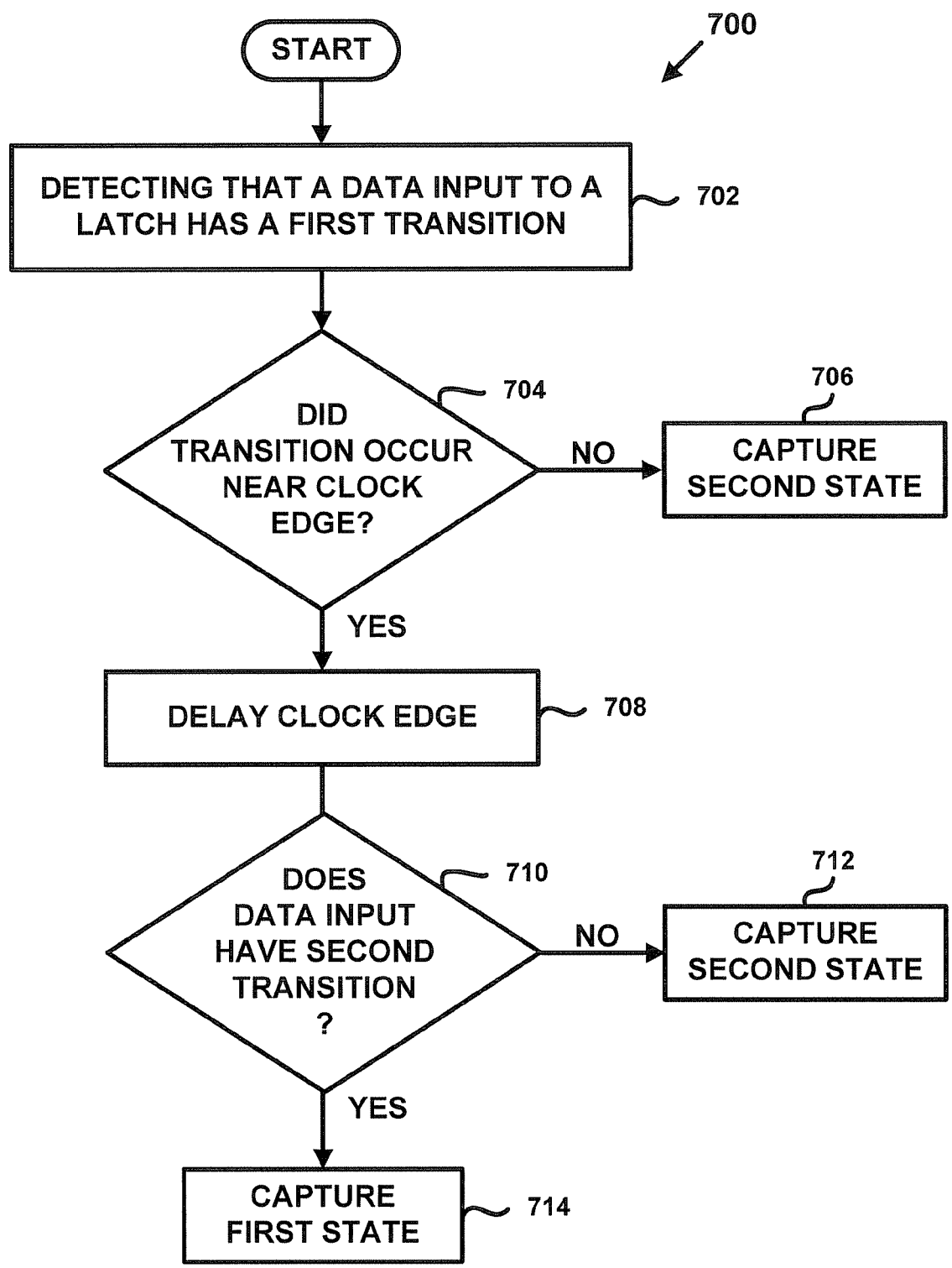
FIG. 7 is a flow diagram of a method for hardening a register, according to an example.

FIG. 7 is a flow diagram of a method 700 for hardening a register. At block 702, the method 700 detects that a data input to a latch has a first transition. The first transition may be a data transition from low to high or from high to low. The data transition may be either a valid data transition or a transient pulse.

At block 704, the method 700 determines whether the transition detected at block 702 is within a time period Td prior to the capturing clock edge of the latch. The time period prior to the capturing edge clock may be determined by the design of the latch and may be an expected duration of a DSET pulse. For example, the time period Td may be approximately 0.5 ns.

At block 706, if a transition did not occur near the clock edge, then the data is captured by the latch as described with respect to scenario #1 in FIG. 6. If the transition occurs near the capturing clock edge, then at block 708, the capturing clock edge is delayed. The clock edge may be delayed for a time period approximately equal to the expected duration of a DSET pulse. As a result, the hold time of the register 100 is approximately equal to the greater of the original hold time or the time of the first transition plus the time period Td.

At block 710, the method 700 determines whether the data input has a second transition within the time period Td from the first transition detected at block 702. The second transition may indicate that the first transition was a transition of a transient pulse. The transient pulse may cause a transition from low to high to low (010) or a transition from high to low to high (101).

At block 712, if a second transition did not occur within the time period Td after the first transition, then the data is captured by the latch as described with respect to scenario #2 in FIG. 6. If the data input has a second transition within Td, at block 714, the method 700 captures the data as described with respect to scenario #3 in FIG. 6. The correct data is most likely captured as the adjusted hold time (CLK-Q time) is increased to allow the transient pulse to transition back to the correct state.

For example, assuming the setup time and hold time of the register 100 are close to zero, Td=0.5 ns, and Tholdorig=0 (i.e., coincident with the capturing clock edge). If the first transition T1 occurs at −0.1 ns (0.1 ns before the capturing clock edge at time zero), then the hold time will be increased to Tholdnew=Tholdorig+(Td−(Tholdorig−T1)). In this example, Tholdnew=0+(0.5 ns−(0−(−0.1 ns)))=0.4 ns. As a result, the capturing clock edge is delayed by 0.4 ns, which may allow a transient pulse to transition to the correct state before the hold time.

By adjusting a register's capturing clock edge timing so that the register captures data when the data returns to a correct state, the register may be protected against DSET. If a data glitch occurs near the clock edge, the valid time at the register output is increased (CLK to Q). This valid time increase occurs when the presence of a DSET transient is detected near the clock edge.

Beneficially, the time increase only occurs when a transient pulse is detected and the increase is limited to the duration of the transient pulse width. As a result, there is no delay (as with filtering) when no transient pulse is detected. Moreover, the method 700 may be used in combination with other hardening techniques, such as TMR and RC delay techniques.

It should be understood that the illustrated embodiments are examples only and should not be taken as limiting the scope of the present invention. For example, other data storage elements, including other register types, such as falling-edge triggered registers, may be hardened as described herein. Additionally, the hardening techniques described may also be applied to other circuits. Moreover, other circuit designs resulting in the same functionality may be used. The claims should not be read as limited to the described order or elements unless stated to that effect. Therefore, all embodiments that come within the scope and spirit of the following claims and equivalents thereto are claimed as the invention.

We claim:

1. A method for mitigating against effects of Digital Single Event Transient (DSET), comprising:
    detecting that a data input to a data storage element has a first transition from a first state to a second state;
    determining whether the first transition occurs prior to a capturing clock edge;
    when the first transition occurs within a time period prior to the capturing clock edge, delaying the capturing clock edge;
    determining whether the data input has a second transition from the second state to the first state within the time period after the first transition; and
    when the data input has the second transition within a time period after the first transition, capturing the first state.

2. The method of claim 1, wherein the data storage element is a register.

3. The method of claim 1, wherein delaying the clock capturing edge includes increasing a hold time of the data storage element.

4. The method of claim 3, wherein a probability that increasing the hold time will result in a capture of an incorrect state is based on at least one of a probability of a charge deposited by a hit, a timing of the hit, a probability that the latch is on a critical path that is active, and a timing margin included for random variation.

5. The method of claim 1, wherein the time period is approximately equal to an expected duration of a DSET pulse.

6. A system for mitigating against the effects of Digital Single Event Transient (DSET), comprising in combination:
    a data storage element operable to latch data based on a clock input; and
    a clock circuit that controls the clock input to the data storage element, wherein the clock circuit increases a hold time of the data storage element by a time period after a transient pulse occurs on a data input to the data storage element so as to delay when the data storage element latches data.

7. The system of claim 6, wherein the data storage element is a register.

8. The system of claim 6, wherein the clock circuit includes a plurality of logic gates to detect the transient pulse.

9. The system of claim 6, wherein the time period is approximately equal to an expected duration of a DSET pulse.

10. The system of claim 6, wherein the clock circuit includes a delay circuit that determines duration of the time period.

11. The system of claim 10, wherein the delay circuit includes a capacitor and a size of the capacitor determines the duration of the time period.

12. The system of claim 10, wherein the delay circuit includes an inverter that is designed to delay a data output transition after a data input transition occurs on the input to the inverter.

13. A system for mitigating against the effects of Digital Single Event Transient (DSET), comprising in combination:
    a data storage element operable to latch data based on two clock signals;
    a delay circuit that receives and inverts a first data input to provide a second data input, wherein the delay circuit delays providing the second data input by a time period; and
    a clock circuit that receives the first data input, the second data input, and a clock input and provides as an output two clock outputs that control the two clock signals, wherein the clock circuit increases a hold time of the data storage element by the time period after a transient pulse occurs on a data input to the data storage element.

14. The system of claim 13, wherein the data storage element is a register.

15. The system of claim 13, wherein the delay circuit includes an inverter that inverts the first data input to provide the second data input.

16. The system of claim 15, wherein the delay circuit includes a capacitor connected to an output of the inverter and a size of the capacitor determines duration of the time period.

17. The system of claim 15, wherein the inverter is designed to delay a data output transition after a data input transition.

18. The system of claim 13, wherein the clock circuit includes an AND gate, an OR gate, a NAND gate, and a NOR gate, wherein the AND gate and the OR gate receive the first data input and the second data input, the NAND gate receives the clock input and an output of the OR gate and provides the first clock output, the NOR gate receives an output of the NAND gate and an output of the AND gate and provides the second clock output.

19. The system of claim 6, wherein the time period is approximately equal to an expected duration of a DSET pulse.

* * * * *